(12) United States Patent
Ren et al.

(10) Patent No.: US 9,471,739 B2
(45) Date of Patent: Oct. 18, 2016

(54) INTEGRATED CIRCUIT (IC) DESIGN METHOD WITH ENHANCED CIRCUIT EXTRACTION MODELS

(71) Applicant: SHANGHAI IC R&D CENTER CO., LTD., Shanghai (CN)

(72) Inventors: Zheng Ren, Shanghai (CN); Shaojian Hu, Shanghai (CN); Wei Zhou, Shanghai (CN); Shoumian Chen, Shanghai (CN); Yuhang Zhao, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 215 days.

(21) Appl. No.: 14/363,357

(22) PCT Filed: Nov. 20, 2012

(86) PCT No.: PCT/CN2012/084898
§ 371 (c)(1),
(2) Date: Jun. 6, 2014

(87) PCT Pub. No.: WO2014/012310
PCT Pub. Date: Jan. 23, 2014

(65) Prior Publication Data
US 2014/0351779 A1    Nov. 27, 2014

(30) Foreign Application Priority Data
Jul. 18, 2012   (CN) .......................... 2012 1 0249620

(51) Int. Cl.
*G06F 17/50* (2006.01)

(52) U.S. Cl.
CPC ....... *G06F 17/5077* (2013.01); *G06F 17/5009* (2013.01); *G06F 17/5068* (2013.01); *G06F 17/5081* (2013.01)

(58) Field of Classification Search
USPC .................... 716/111, 113, 115, 119, 126
See application file for complete search history.

(56) References Cited

U.S. PATENT DOCUMENTS

| | | | |
|---|---|---|---|
| 2005/0172251 A1* | 8/2005 | Chang | G06F 17/5036 716/113 |
| 2007/0124707 A1* | 5/2007 | Sutjahjo | G06F 17/5018 716/113 |
| 2009/0007035 A1* | 1/2009 | Su | G01R 31/2853 716/106 |

* cited by examiner

*Primary Examiner* — Brian Ngo
(74) *Attorney, Agent, or Firm* — Anova Law Group, PLLC

(57) ABSTRACT

A method is provided for designing an IC chip. The method includes receiving data from a pre-layout design process for the IC chip, routing a plurality of interconnecting wires to connect various devices of the IC chip, and extracting various circuit parameters. The method also includes simulating the IC chip using the extracted various circuit parameters to detect logic or timing error in the IC chip. The extracting the various circuit parameters includes establishing a statistical interconnect technology profile (ITP) file containing at least interconnect parasitic parameters based on correlations of interconnect layer geometric parameter variations.

18 Claims, 5 Drawing Sheets

INTEGRATED CIRCUIT (IC) DESIGN METHOD WITH ENHANCED CIRCUIT EXTRACTION MODELS

CROSS-REFERENCES TO RELATED APPLICATIONS

This application claims the priority of Chinese patent application number 201210249620.X, filed on Jul. 18, 2012, the entire contents of which are incorporated herein by reference.

FIELD OF THE INVENTION

The present invention generally relates to the field of integrated circuit (IC) design technologies and, more particularly, to techniques improving post-layout design during the IC design and fabrication process.

BACKGROUND

Electronic design automation (EDA) software for integrated circuit (IC) has rapidly increased in importance with the continuous scaling of semiconductor technology. An IC design software often needs various simulation steps to optimize the circuit design parameters, such as pre-layout simulation and post-layout simulation, etc. However, as the IC process technology scales into sub-100 nm, the interconnects become thinner and denser. The performance of nanoscale integrated circuits may be limited because RC delay becomes no less than MOSFET gate delay.

Various techniques have been proposed to simulate back-end of line (BEOL) interconnect delay using layout parasitic extraction (LPE) tools during IC circuit design and verification. Currently, during post-layout simulation, the interconnect RC parasitic parameters are extracted by rules based on existing interconnect technology profile (ITP) using the LPE tools. However, in order to assess the parasitic RC variation, extreme ITP parameters value may needed to be used in the current method. Although this method allows IC designers to sign off a design with extreme process conditions, it limits the design margin and may cause overhead in the design.

The disclosed methods and systems are directed to solve one or more problems set forth above and other problems.

BRIEF SUMMARY OF THE DISCLOSURE

One aspect of the present disclosure includes a method for designing an IC chip. The method includes receiving data from a pre-layout design process for the IC chip, routing a plurality of interconnecting wires to connect various devices of the IC chip, and extracting various circuit parameters. The method also includes simulating the IC chip using the extracted various circuit parameters to detect logic or timing error in the IC chip. The extracting the various circuit parameters includes establishing a statistical interconnect technology profile (ITP) file containing at least interconnect parasitic parameters based on correlations of interconnect layer geometric parameter variations.

Another aspect of the present disclosure includes a computer-readable medium storing computer programs. The computer programs can be executed by a computer and perform a method for designing an IC chip. The method includes receiving data from a pre-layout design process for the IC chip, routing a plurality of interconnecting wires to connect various devices of the IC chip, and extracting various circuit parameters. The method also includes simulating the IC chip using the extracted various circuit parameters to detect logic or timing error in the IC chip. The extracting the various circuit parameters includes establishing a statistical interconnect technology profile (ITP) file containing at least interconnect parasitic parameters based on correlations of interconnect layer geometric parameter variations.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers may be used throughout the drawings to refer to the same or like parts.

Figure 1:
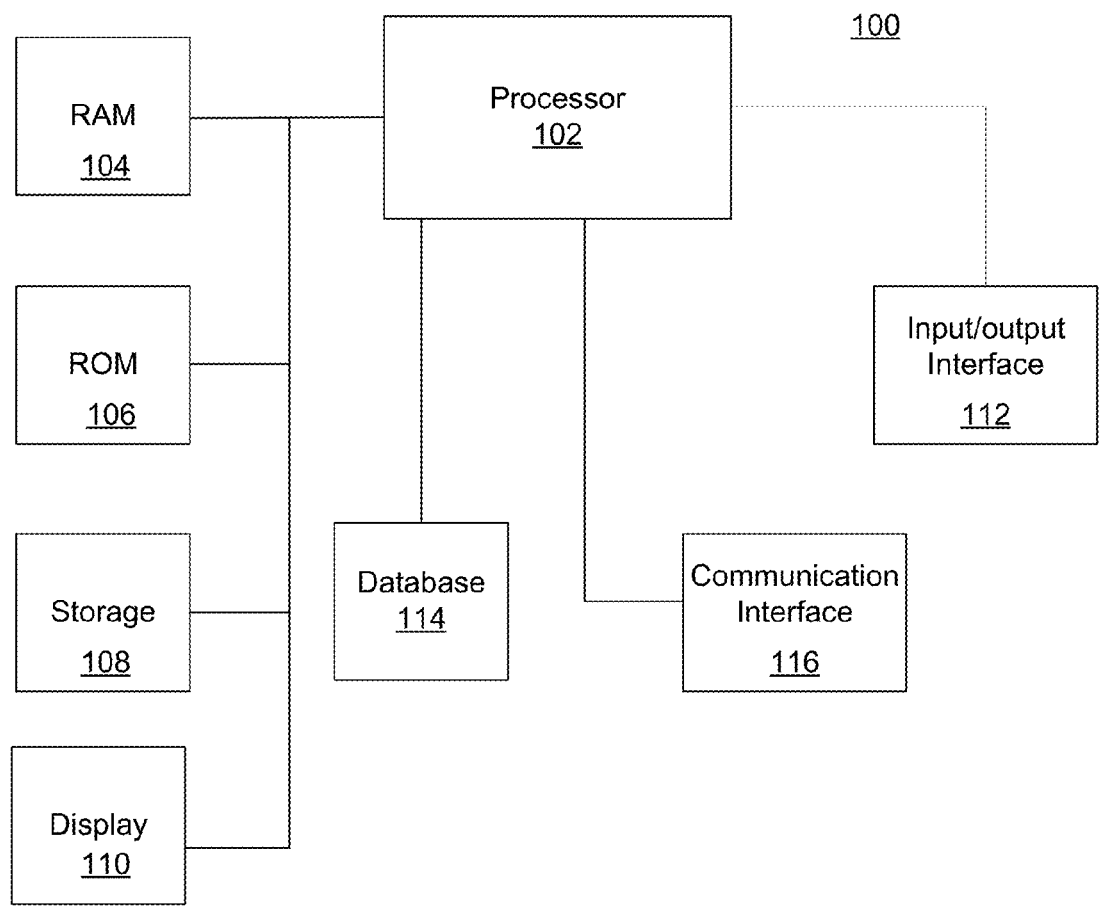
FIG. 1 illustrates an exemplary electronic design automation (EDA) system consistent with the disclosed embodiments.

FIG. 1 shows an exemplary block diagram of an electronic design automation (EDA) system 100. The EDA system 100 may include any appropriately configured computer system. As shown in FIG. 1, system 100 may include a processor 102, a random access memory (RAM) unit 104, a read-only memory (ROM) unit 106, a storage unit 108, a display 110, an input/output interface unit 112, a database 114; and a communication interface 116. Other components may be added and certain devices may be removed without departing from the principles of the disclosed embodiments.

Processor 102 may include any appropriate type of general purpose microprocessor, digital signal processor or microcontroller, and application specific integrated circuit (ASIC). Processor 102 may execute sequences of computer program instructions to perform various processes associated with system 100. The computer program instructions may be loaded into RAM 104 for execution by processor 102 from read-only memory 106, or from storage 108. Storage 108 may include any appropriate type of mass storage provided to store any type of information that processor 102 may need to perform the processes. For example, storage 108 may include one or more hard disk devices, optical disk devices, flash disks, or other storage devices to provide storage space.

Display 110 may provide information to a user or users of system 100. Display 110 may include any appropriate type of computer display device or electronic device display (e.g., CRT or LCD based devices). Input/output interface 112 may be provided for users to input information into system 100 or for the users to receive information from system 100. For example, input/output interface 112 may include any appropriate input device, such as a keyboard, a mouse, an electronic tablet, voice communication devices, or any other optical or wireless input devices. Further, input/output interface 112 may receive from and/or send to other external devices.

Further, database 114 may include any type of commercial or customized database, and may also include analysis tools for analyzing the information in the databases. Database 114 may be used for storing information for IC design and fabrication process and other related information. Communication interface 116 may provide communication connections such that system 100 may be accessed remotely and/or communicate with other systems through computer networks or other communication networks via various communication protocols, such as transmission control protocol/internet protocol (TCP/IP), hyper text transfer protocol (HTTP), etc.

Figure 2:
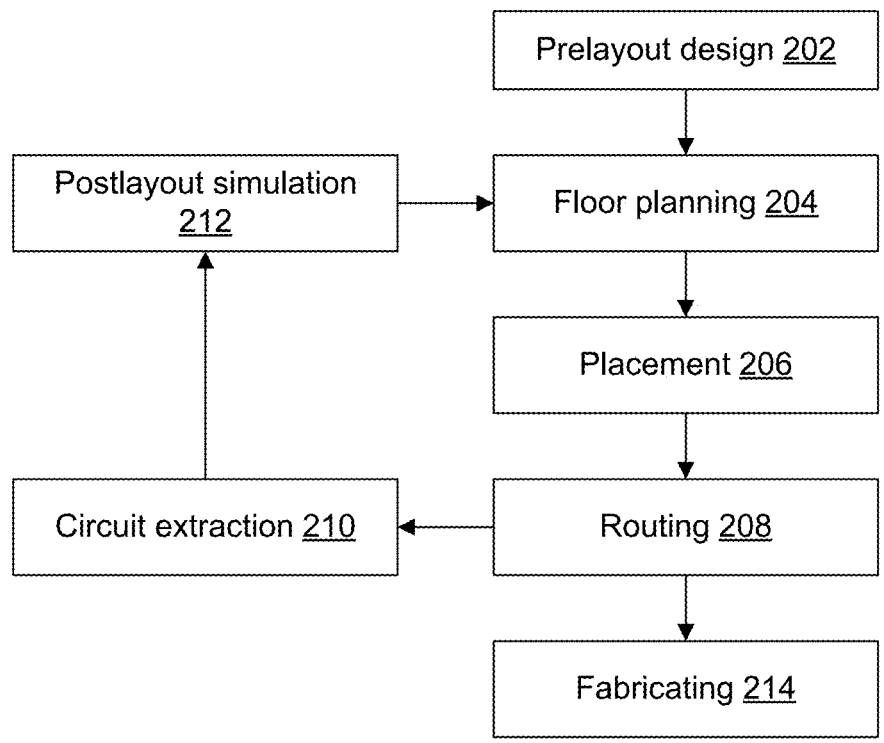
FIG. 2 illustrates an exemplary IC design process consistent with the disclosed embodiments.

During operation, system 100 or, more particularly, processor 102 may perform certain processes to facilitate IC design and fabrication. FIG. 2 illustrates an exemplary IC design process 200 performed by system 100 and, more particularly, by processor 102 of system 100.

As shown in FIG. 2, the IC design process 200 may include a variety of stages or processes. For example, the IC design process 200 may include pre-layout design 202, floor planning 204, placement 206, routing 208, circuit extraction 210, post-layout simulation 212, and fabricating 214. Certain stages or steps/processes may be omitted and other stages or steps/processes may be added.

The pre-layout design 202 may include various design processes for system-level design and register transfer level (RTL) design. After the completion of the pre-layout design 202, functionalities of an IC chip may be determined and the design data, such as the RTL file, is provided to floor planning 204.

The EDA system 100 receives the design data from the pre-layout design process 202 and continues with the floor planning process 204. During floor planning 204, the RTL of the IC chip may be assigned to gross regions of the IC chip, input/output (I/O) pins may be assigned, and large objects (arrays, cores, etc.) may be placed. Further, the RTL may be mapped into a gate-level netlist in the target technology of the IC chip.

During placement 206, the gates in the netlist may be assigned to non-overlapping locations on the die area of the IC chip, and clock signal wiring may be introduced into the design. After the placement 206, routing 208 may be performed. That is, the interconnects or the wires that connect the gates in the netlist are added.

After routing 208, the layout of the IC chip is completed, and the layout may be provided to fabrication process 214, which physically fabricates the IC chip. However, to optimize the performance and power and other constraints, a post-layout optimization process may be iteratively performed with the floor planning 204, placement 206, and routing 208.

For example, the circuit extraction 210 may extract various circuit parameters. The circuit extraction 210 may, based on the connection length and load of the interconnects, extract parasitic resistor/capacitor parameters of every interconnect to obtain corresponding time delay information. The post-layout simulation 212 may put the extracted circuit parameters into the IC circuit and to simulate the circuit to detect any logic or timing error in the circuit.

In certain embodiments, during the circuit extraction 210 and/or post-layout simulation 212, the system 100 may extract certain interconnect technology profile (ITP) parameters, such as interconnect parasitic parameters, based on the correlations of interconnect layer geometric parameters variations.

Figure 3:
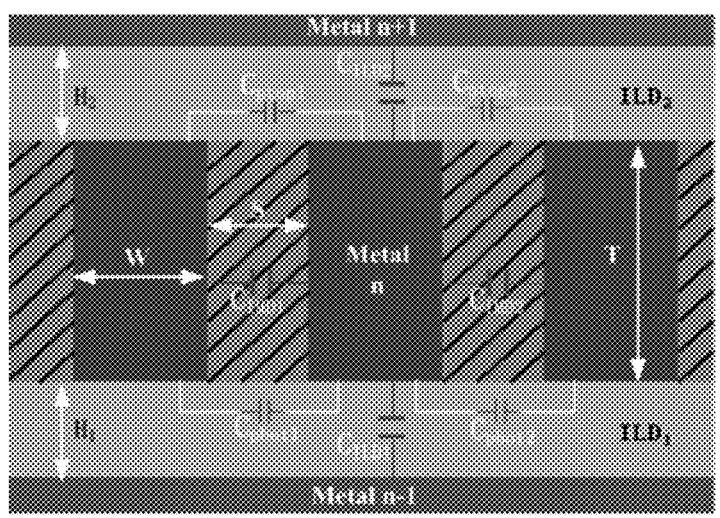
FIG. 3 illustrates parasitic capacitances around a metal wire in a metal layer consistent with the disclosed embodiments.

There are various parasitic capacitances within multi-layer interconnects in an IC chip. FIG. 3 illustrates the parasitic capacitances around a metal wire in the n-th metal layer (Metal n) and n is an integer greater than 2. As shown in FIG. 3, Metal n+1 means the metal layer above Metal n and Metal n−1 is the one below Metal n.

$ILD_1$ is the inter layer dielectric (ILD) between Metal n and Metal n−1 and $H_1$ is its thickness; $ILD_2$ is ILD between Metal n and n+1 which thickness is $H_2$; L, W and T are the length, width and thickness of metal strips in Metal n; S is the space between two metal wire strips. Further, $\epsilon_{IMD}$ is the permittivity of Inter Metal Dielectric (IMD) material among strips of Metal n. $\epsilon_{ILD1}$ is the permittivity of $ILD_1$ and $\epsilon_{ILD2}$ is the permittivity of $ILD_2$.

The parasitic capacitances in FIG. 3 can be expressed as:

$$C_{ILD1} \propto \epsilon_{ILD1}(W*L/H_1) \quad (1)$$

$$C_{ILD2} \propto \epsilon_{ILD2}(W*L/H_2) \quad (2)$$

$$C_{coupling} = C_{ptop1} + C_{ptop2} + C_{pbot1} + C_{pbot2} + C_{IMD1} + C_{IMD2} \quad (3)$$

$$C_{coupling} \propto \epsilon_{IMD}(T*L/S) \quad (4)$$

$$C_{total} = C_{coupling} + C_{ILD1} + C_{ILD2} \quad (5)$$

where $C_{ILD2}$ is the parasitic capacitor between this metal wire and other metal wires on Metal n+1; $C_{ILD1}$ is the parasitic capacitor between this metal wire and other metal wires on Metal n−1; $C_{IMD1}$ and $C_{IMD2}$ are parasitic capacitors induced by IMD material between this metal wire and other wires neighbor to it. $C_{ptop1}$, $C_{pbot1}$, $C_{ptop2}$, $C_{pbot2}$ are the fringe coupling capacitors induced by ILD material. $C_{Coupling}$ represents the sum coupling parasitic capacitors between this wire and all the other wires in the same metal layer.

These parasitic capacitor parameters are part of an ITP of the IC chip. Further, when the interconnect parasitic capacitor parameters are extracted by using, for example, a BEOL interconnect parasitic extraction method, the plurality of different predefined layout structures may be used as the references for the actual fabrication process, i.e., the test, measuring, or verification structures.

For example, five types of structures may be predefined for BEOL interconnect parasitic extraction, Massive single layer coupling metal-oxide-metal (MOM) capacitors $C_{Mcoupling}$, Massive MOM capacitors between two layers $C_{intra-layers}$, Common Inverter RO $RO_{common}$, Inverter RO loaded with $C_{Mcoupling}$ $RO_{Mcoupling}$, and Inverter RO loaded with $C_{intra-layers}$ $RO_{intra-layers}$. Other structures may also be used.

Figure 4:
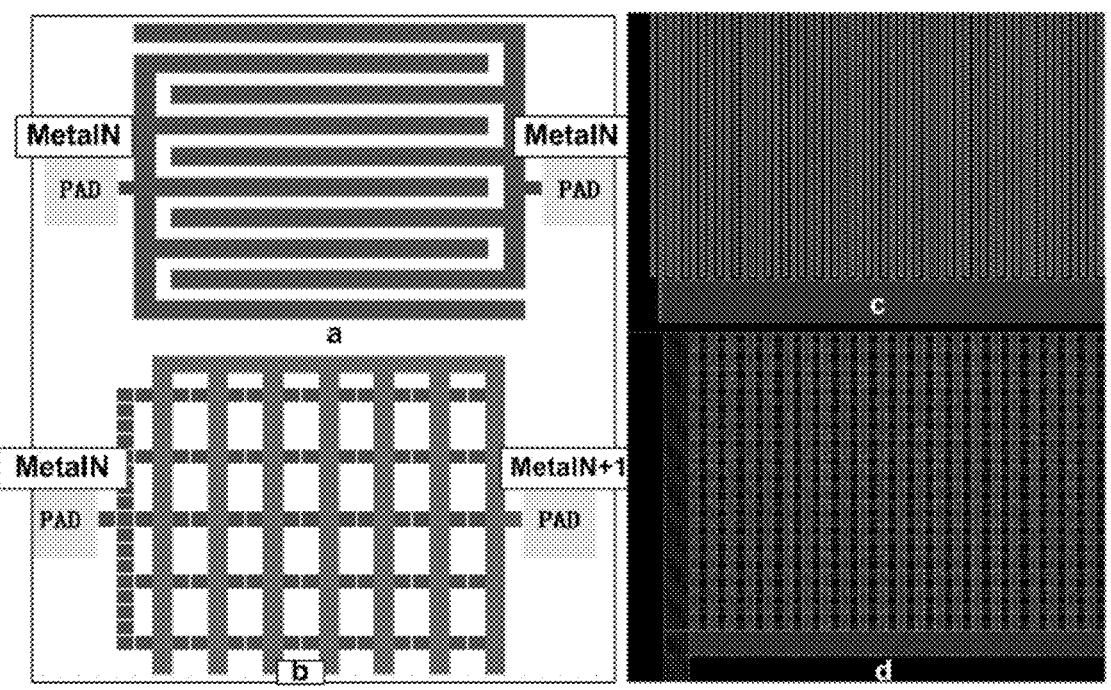
FIG. 4 illustrates certain exemplary measuring structures consistent with the disclosed embodiments.

More particularly, as shown in FIG. 4(a), $C_{Mcoupling}$ is the massive metal comb MOM capacitor on every single metal layer. That is, $C_{Mncoupling}$ represents the single-layer coupling MOM capacitors in Metal n. FIG. 4(c) shows a corresponding layout. For example, $C_{M1coupling}$ is coupling MOM capacitors in Metal 1. According to Equation (3), the Capacitance is determined by T of Metal n, permittivity of the IMD layers cIMD, and the effective area of capacitor.

Further, as shown in FIG. 4(b), $C_{intra-layers}$ is the massive MOM capacitor composed of metal comb in two overlapped neighbor metal layers. The value of $C_{intra-layers}$ between two metal layers is mainly determined by sum $C_{ILD}$ of all metal strips of $C_{intra\text{-}layers}$. According to Equation (4) and (5), the total parasitic intra-layer capacitance of this structure is mainly determined by the height of layer between two metal layers, its permittivity $\epsilon_{ILD}$, and the effective overlapped region area. FIG. 4(d) shows a corresponding layout. For example, $C_{intraMnM(n+1)}$ represents the Massive MOM capacitors composed of metal combs between Metal n and n+1. For example, $C_{intraM1M2}$ is intra-layer MOM capacitors between Metal 1 and Metal 2.

Figure 5:
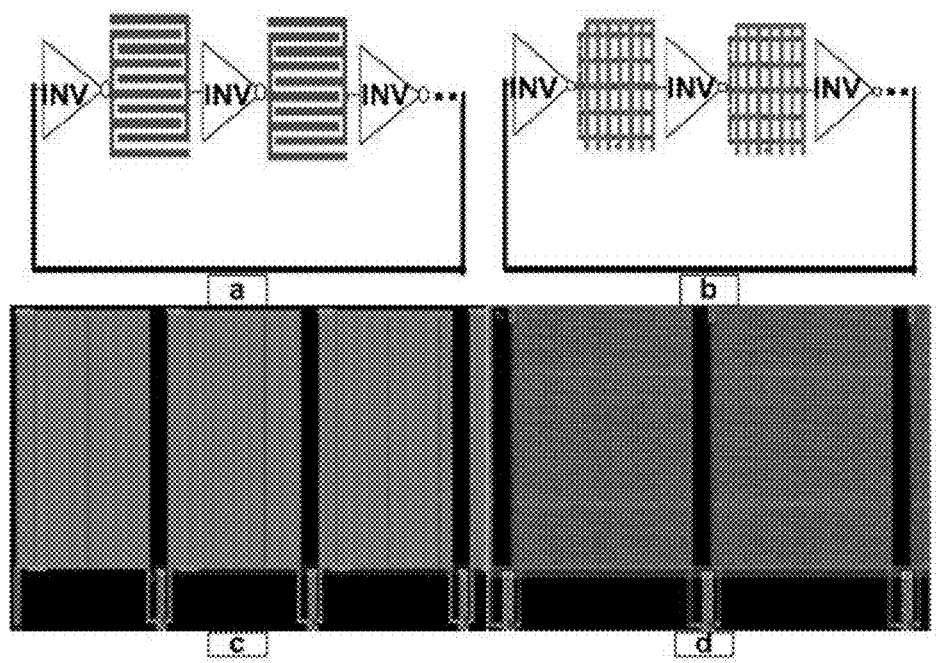
FIG. 5 illustrates certain exemplary measuring structures consistent with the disclosed embodiments.

$RO_{common}$ is the Inverter Ring Oscillator (RO) for unit gate delay measurement without any metal RC load. Further, as shown in FIG. 5(a), $RO_{Mcoupling}$ is the Inverter RO with small-size $C_{Mcoupling}$ loaded between every neighboring inverters. FIG. 5(c) shows a corresponding layout. For example, $RO_{Mncoupling}$ represents $RO_{Mcoupling}$ with $C_{Mncoupling}$ loaded.

Further, as shown in FIG. 5(b), $RO_{intra\text{-}layers}$ is the Inverter RO with small-size $C_{intra\text{-}layers}$ loaded between every neighboring inverters. FIG. 5(d) shows a corresponding layout. For example, $RO_{intraMnM(n+1)}$ represents $RO_{intra\text{-}layers}$ with $C_{intraMnM(n+1)}$ loaded.

Figure 6:
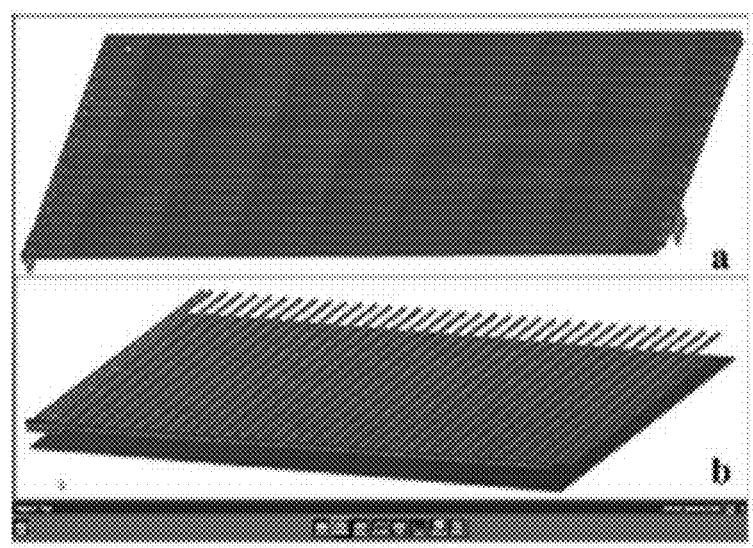
FIG. 6 illustrates certain exemplary simulated structures consistent with the disclosed embodiments.

With the measured capacitance value and known metal wires length and width, not only the actual thickness of metal layers and actual $\epsilon_{IMD}$, but also the actual height of ILD and $\epsilon_{ILD}$ among the two metal layers can be extracted using 3D RC parasitic simulation and 3D structures can be built with geometric parameters of $C_{Mcoupling}$ and $C_{intra\text{-}layers}$'s layouts in Synopsys Raphael Interconnect Parasitic RC 3D simulator, as shown in FIG. 6(a) and FIG. 6(b), respectively, in which simulation can be performed and simulated capacitor values can be obtained.

Figure 7:
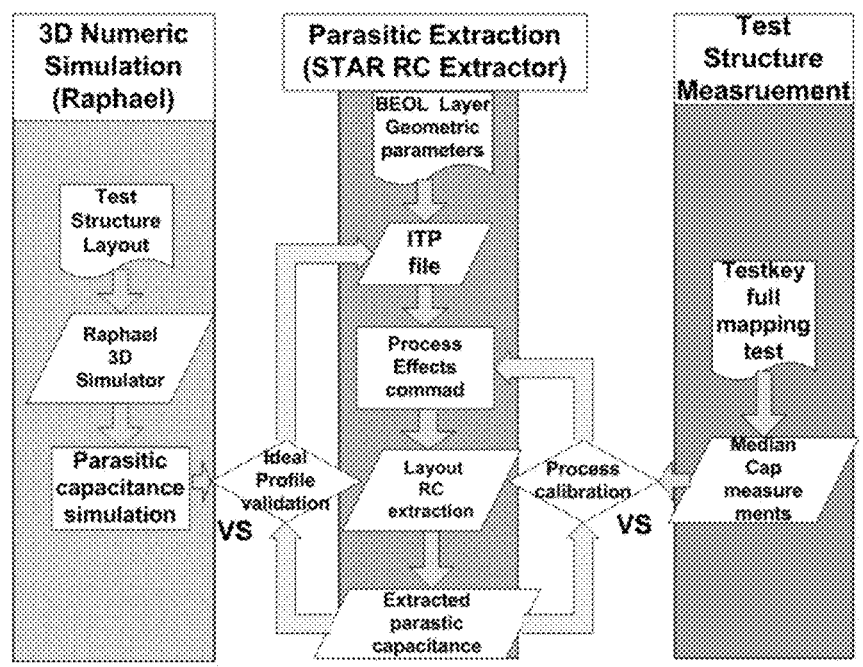
FIG. 7 illustrates an exemplary process for extracting a typical ITP file consistent with the disclosed embodiments.

Further, a typical interconnect technology profile (ITP) file may be generated. FIG. 7 illustrates an exemplary process for extracting a typical ITP file.

As shown in FIG. 7, the typical ITP file extraction process includes a 3D numeric simulation process, a parasitic extraction process, and a test structure capacitance measurement process. The ITP file may contain specific values of the geometric parameters and dielectric layer permittivity values of the dielectric. Further, 3D field-effect simulation software (e.g., Synopsys Raphael 3D or Raphael NXT) may be used to simulate the parasitic capacitance of different sizes of metal interconnect layers and to obtain the capacitance value under the ideal condition.

Meanwhile, based on the ITP file, LPE software tools (e.g., Synopsys STAR RC) may be used to generate parasitic extraction rules, including the parasitic parameters such as parasitic resistance and parasitic capacitance. The difference between the 3D simulation software and the LPE software may include that: the 3D simulation software is a time-consuming but high-precision numerical simulation, while the LPE software extraction rule generation method the low-accuracy but less time-consuming analytical simulation. To ensure the accuracy of the extraction rules, actual measurement results of the measuring structures and the 3D numerical simulation results are used to extract and correct the process parameter values in the ITP file, and then to measure the process parameters of the metal interconnect layers and single layer coupling capacitance with process calibration and extraction. The ITP file can then be generated.

That is, the prefabricated test/measuring structures' capacitances can be measured to define process induced differences between actual layout dimension values and ideal values, then to calibrate the ITP file for LPE software. Based on the extraction flow, for each measured/test structure, the wafers are scanned to measure each measuring/test structure, the measurement results of the same structure in every different chip are recorded, and the statistical distribution is analyzed to obtain the measured median. The measured median is then used to verify the simulation values of the capacitance of the test structure, and to extract the process parameter values of metal interconnect layers and the dielectric layers among the metal interconnect layers. An accurate ITP file can then be generated. Further, according to extraction rules of the ITP file, the test structures are extracted, and extraction values of metal interconnect layer capacitance can also be obtained.

The difference among the statistical measurement value (median), simulation value, and the extraction value of the large-size parasitic capacitance measurement structure can be reduced through the optimization and adjustment of process parameter values in the ITP file. Table 1 shows the three types of values of the large-size parasitic capacitance of all metal layers based on the optimized typical ITP file. A total of 7 metal interconnect layers are used in the measured structure.

TABLE 1

Measurements, Simulations and Extracted Values of Each Structure

| Parasitic Capacitor | Value(pF) | | | Extracted Values vs Measured Values |
|---|---|---|---|---|
| | Measured | Simulated | Extracted | |
| $C_{M1Coupling}$ | 107.4 | 103.1 | 108.1 | −0.63% |
| $C_{M2Coupling}$ | 92.5 | 102.6 | 96.7 | −4.50% |
| $C_{M3Coupling}$ | 98.2 | 101.1 | 94.2 | 4.06% |
| $C_{M4Coupling}$ | 93.9 | 104.2 | 98.1 | −4.41% |
| $C_{M5Coupling}$ | 95.6 | 103.9 | 98.4 | −2.93% |
| $C_{M6Coupling}$ | 91.6 | 98.1 | 92.7 | −1.28% |
| $C_{M7Coupling}$ | 95.5 | 100.4 | 93.8 | 1.79% |
| $C_{intraM1M2}$ | 42.0 | 39.2 | 41.1 | 2.05% |
| $C_{intraM2M3}$ | 48.3 | 43.8 | 47.3 | 2.01% |
| $C_{intraM3M4}$ | 41.8 | 40.6 | 43.1 | −2.96% |
| $C_{intraM4M5}$ | 48.2 | 43.9 | 47.3 | 1.78% |
| $C_{intraM5M6}$ | 44.3 | 40.1 | 42.5 | 4.05% |
| $C_{intraM6M7}$ | 43.9 | 40.0 | 42.0 | 4.28% |

As shown in Table 1, the difference among these values is very small. Especially, the difference between the extract and measured values is below 5%.

Further, the above parasitic capacitance variables may be correlated and thus may be inaccurate when extracted independently or may be unnecessarily limiting the range of the variables. The Principal Component Analysis (PCA) method may used to introduce a validated way to map the correlated random variable parasitic capacitors' values into independent and uncorrelated variables.

For example, the $C_{Mcoupling}$ from M2~M7 can be analyzed and reduced order to several group of independent variables. Assuming $V_{cMcoupling} = [C_{M2coupling}, C_{M2coupling}, \ldots C_{M7coupling}]$ is random variable vector, representing the known correlated variable measured capacitance value of $C_{Mcoupling}$ in each layers, $V_{CMncoupling(n=2, \ldots 7)}$ is the random variable with Gaussian Distribution, $\mu = [\mu_{N2coupling}, \ldots \mu_{M7coupling}]$ is the mean vector of $V_{CMcoupling}$ and $C_v$ is the covariance matrix of $V_{CMcoupling}$. Applying PCA, corresponding uncorrelated random variables $\phi = [\phi_2, \ldots \phi_7]$ can be expressed by Equation (6):

$$\phi = A(V_{CMcoupling} - \mu) \qquad (6)$$

where, $A=[e_1, \ldots e_7]$ is the orthogonal mapping matrix, $e_i$ is the corresponding eigenvector to eigenvalue $\lambda_i$, which satisfies:

$$\lambda_i e_i = C_v e_i \qquad (7)$$

The distribution of the random variables $\phi_i$ can be expressed as:

$$\phi_i = u_i + \sigma_i \tau_i \ (i=2,3.7) \qquad (8)$$

where $u_i$ is the mean value of $\phi_i$ and $\sigma_i$ is the standard deviation of $\phi_i$.

Thus, the correlated random variable vector $V_{CMcoupling}$ can be expressed with uncorrelated orthogonal normalized random variables $$\begin{aligned} V_{CMcoupling} &= A^{-1}\phi + u \\ &= \sum_{j=1}^{n}(a_{ij}\sqrt{\lambda_j}\xi_j + u_i), \\ i &= 1, 2, \ldots, n \end{aligned} \qquad (9)$$

where $a_{ij}$ is the ith row, jth column element in the orthogonal mapping matrix A defined in Equation (6).

As shown in Table 2 below, the variable with Gaussian Distributions of 6 kinds of coupling capacitors can be expressed by two principal components with accumulated contribution rate bigger than 95%. It means $C_{Mcoupling}$ from M2~M7 can be reduced order to a vector of two or even one random variables.

TABLE 2

Principal Components of Coupling Parasitic Capacitors

| Parasitic Capacitor | Principal Components of Coupling parasitic Capacitors | | |
|---|---|---|---|
| | ξ1 | ξ2 | ξ3 |
| $C_{M2Coupling}$ | 0.94 | 0.33 | 0.10 |
| $C_{M3Coupling}$ | 0.98 | 0.07 | 0.07 |
| $C_{M4Coupling}$ | 0.99 | 0.02 | −0.10 |
| $C_{M5Coupling}$ | 0.98 | −0.09 | −0.14 |
| $C_{M6Coupling}$ | 0.93 | −0.34 | 0.14 |
| $C_{M7Coupling}$ | 0.98 | 0.02 | −0.03 |
| Eigen Value | 1.87E−22 | 7.28E−24 | 2.16E−24 |
| Percent of Trace | 93.86% | 3.65% | 1.08% |
| Accumulated contributed rate | 93.86% | 97.51% | 98.59% |

For example, the variable capacitance of M2 coupling capacitors $V_{CM2coupling}$ can be expressed as:

$$V_{CM2coupling} = U_{M2coupling} + a_{11}\sqrt{\lambda_1}\xi_1 + a_{12}\sqrt{\lambda_2}\xi_2 \qquad (10)$$

where $u_{M2coupling}$ is the mean value of $C_{M2coupling}$ and the typical interconnect technology parameters can be extracted with its value. Moreover, the statistical parameters of ITP variation parameters can also be extracted from the distribution of $\xi_1$ and $\xi_2$.

Figure 8:
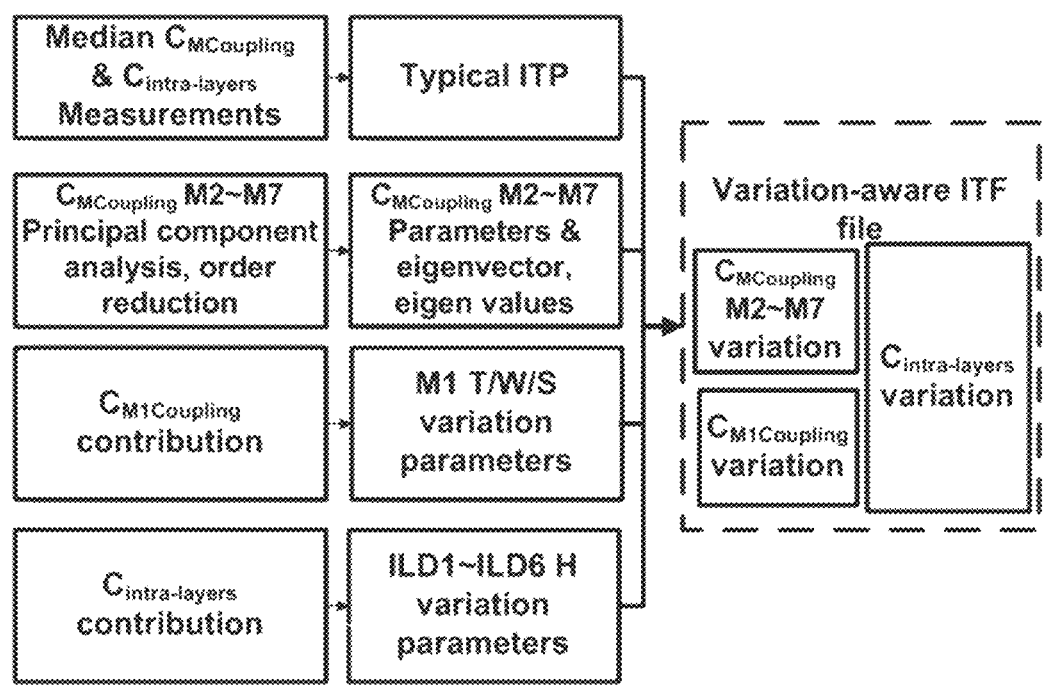
FIG. 8 illustrates an exemplary process for generating corner ITP file associated with process differences consistent with the disclosed embodiments.

Thus, based on the above descriptions, FIG. 8 illustrates an exemplary statistical ITP file extraction flow consistent with the disclosed embodiments. As previously disclosed, at the beginning, a plurality of predefined measuring/test structures may be prefabricated and metal layer interconnection parasitic parameters and single layer coupling capacitance are measured (e.g., median $C_{Mcoupling}$ and $C_{intra-layers}$ measurements), and a typical ITP file is generated.

Further, the single coupling capacitance $C_{Mcoupling}$ in each metal layer is used to obtain N number of correlated single layer coupling capacitance variables (e.g., $C_{Mcoupling}$ M2-M7), where N is an integer greater than 2. A Principal Component Analysis (PCA) method is used to statistically analyze the N number of correlated single layer coupling capacitance variables to convert or map these correlated variables into M number of independent and uncorrelated variables (e.g., $C_{Mcoupling}$ M2-M7 Principal component analysis, order reduction).

The M number of independent variables are statistically analyzed to obtain the process parameters and their statistical distributions corresponding to the M independent variables. The process parameters and their statistical distributions, as well as the orthogonal mapping matrix and the eigenvalue (e.g., $C_{Mcoupling}$ M2-M7 Parameters & eigenvector, eigen values) are used to express the N number of correlated single layer coupling capacitance variables.

Based on the process parameters and their statistical distributions, as well as the orthogonal mapping matrix and the eigenvalue, corresponding to the M number of independent and un-correlated variables, ITP files including the process parameters and their statistical calculation of the M number of independent and un-correlated variables can be obtained.

Further, in addition to the correlations of the process parameters, the process parameters themselves and variations are also included in the ITP files. For example, the $C_{M1coupling}$ contribution and M1 T/W/S variation parameters are also included, as well as the $C_{intra-layers}$ contribution and ILD1-ILD6 H variation parameters.

The statistical ITP file, also called the variation-aware ITP file, may then be created to include a variety of ITP files reflecting the correlation of the coupling capacitance of the metal interconnect layers and parameters of each of the metal interconnect layers. Such statistical ITP file can accurately reflect the parasitic capacitance of the metal interconnect layers.

By using the disclosed methods and systems, novel techniques can be developed to perform correlation-considered statistical interconnect parasitic parameters extraction based on, for example, a 40 nm CMOS process technology. Interconnect Technology Profile (ITP) file can be carefully calibrated using 3D simulations based on a comprehensive set of test structures and full mapping tests are performed on these structures to obtain statistical distribution of the layout parasitics. With the statistical data and process information, statistical ITP parameters are extracted using Principal Component Analysis (PCA) method and verified with circuit level verification. The extracted statistical ITP may be accurate and necessary for neon-scale IC process technologies. The issues of the conventional techniques, such as etching damages to the metal film resistor when forming upper copper interconnect to connect the metal film resistor, can be solved and the reliability of the metal film resistor can be substantially increased. Those of ordinary skill in the art can make changes and modifications without departing from the principles and spirits of the present invention.

What is claimed is:

1. A method for designing an integrated circuit (IC) chip, comprising:
   receiving data from a pre-layout design process for the IC chip;
   routing a plurality of interconnecting wires to connect various devices of the IC chip;
   extracting various circuit parameters; and
   simulating the IC chip using the extracted various circuit parameters to detect logic or timing error in the IC chip, wherein the extracting the various circuit parameters includes establishing a statistical interconnect technology profile (ITP) file containing at least interconnect parasitic parameters based on correlations of interconnect layer geometric parameter variations;

wherein establishing the statistical ITP file further includes:

measuring metal layer interconnection parasitic parameters and single layer coupling capacitances of a plurality of prefabricated measuring structures;

obtaining N number of correlated single layer coupling capacitance variables based on the single coupling capacitances, where N is an integer greater than 2; and converting the N number of correlated single layer coupling capacitance variables into M number of independent and uncorrelated variables, where M is an integer less than N, using a Principal Component Analysis (PCA) method.

2. The method according to claim 1, further including:
obtaining process parameters and relative statistical distributions corresponding to the M number of independent and uncorrelated variables, wherein the process parameters, the relative statistical distributions, an orthogonal mapping matrix, and eigenvalues are used to express the N number of correlated single layer coupling capacitance variables.

3. The method according to claim 2, further including:
obtaining individual ITP files containing the process parameters, statistical calculation of the M number of independent and un-correlated variables, variations of the process parameters; and establishing the statistical ITP file including the individual ITP files and reflecting correlation of coupling capacitance of metal interconnect layers and parameters of each of the metal interconnect layers.

4. The method according to claim 1, wherein the plurality of prefabricated measuring structures includes:
a massive metal comb metal-oxide-metal (MOM) capacitor on a single metal layer, represented as CMcoupling.

5. The method according to claim 4, wherein the plurality of predefined measuring structures further includes:
a massive metal-oxide-metal (MOM) capacitor composed of a metal comb in two overlapped neighbor metal layers, represented as Cintra-layers.

6. The method according to claim 5, wherein the plurality of predefined measuring structures further includes:
an inverter ring oscillator (RO) for unit gate delay measurement without any metal resistance-capacitance (RC) load.

7. The method according to claim 5, wherein the plurality of predefined measuring structures further includes:
a plurality of inverters ring oscillator (RO) with CMcoupling loaded between every neighboring inverters.

8. The method according to claim 5, wherein the plurality of predefined measuring structures includes:
a plurality of inverters ring oscillator (RO) with small-size Cintra-layers loaded between every neighboring inverters.

9. The method according to claim 1, wherein:
the interconnect parasitic parameters includes interconnect parasitic capacitances.

10. A computer-readable medium storing computer programs capable of performing, when executed by a computer, a method for designing an integrated circuit (IC) chip, the method comprising:

receiving data from a pre-layout design process for the IC chip;

routing a plurality of interconnecting wires to connect various devices of the IC chip;

extracting various circuit parameters; and simulating the IC chip using the extracted various circuit parameters to detect logic or timing error in the IC chip, wherein the extracting the various circuit parameters includes establishing a statistical interconnect technology profile (ITP) file containing at least interconnect parasitic parameters based on correlations of interconnect layer geometric parameter variations;

wherein establishing the statistical ITP file further includes:

obtaining measurements of metal layer interconnection parasitic parameters and single layer coupling capacitances of a plurality of prefabricated measuring structures;

obtaining N number of correlated single layer coupling capacitance variables based on the single coupling capacitances, where N is an integer greater than 2; and converting the N number of correlated single layer coupling capacitance variables into M number of independent and uncorrelated variables, where M is an integer less than N, using a Principal Component Analysis (PCA) method.

11. The computer-readable medium according to claim 10, further including:
obtaining process parameters and relative statistical distributions corresponding to the M number of independent and uncorrelated variables, wherein the process parameters, the relative statistical distributions, an orthogonal mapping matrix, and eigenvalues are used to express the N number of correlated single layer coupling capacitance variables.

12. The computer-readable medium according to claim 11, further including:
obtaining individual ITP files containing the process parameters, statistical calculation of the M number of independent and un-correlated variables, variations of the process parameters; and establishing the statistical ITP file including the individual ITP files and reflecting correlation of coupling capacitance of metal interconnect layers and parameters of each of the metal interconnect layers.

13. The computer-readable medium according to claim 10, wherein the plurality of prefabricated measuring structures includes:
a massive metal comb metal-oxide-metal (MOM) capacitor on a single metal layer, represented as CMcoupling.

14. The computer-readable medium according to claim 13, wherein the plurality of prefabricated measuring structures further includes:
a massive metal-oxide-metal (MOM) capacitor composed of a metal comb in two overlapped neighbor metal layers, represented as Cintra-layers.

15. The computer-readable medium according to claim 14, wherein the plurality of prefabricated measuring structures further includes:
an inverter ring oscillator (RO) for unit gate delay measurement without any metal resistance-capacitance (RC) load.

16. The computer-readable medium according to claim 14, wherein the plurality of prefabricated measuring structures further includes:

a plurality of inverters ring oscillator (RO) with CMcoupling loaded between every neighboring inverters.

17. The computer-readable medium according to claim 14, wherein the plurality of prefabricated measuring structures includes:
   a plurality of inverters ring oscillator (RO) with small-size Cintra-layers loaded between every neighboring inverters.

18. The computer-readable medium according to claim 10, wherein:
   the interconnect parasitic parameters includes interconnect parasitic capacitances.

* * * * *